US009552252B2

United States Patent
Trantham et al.

(10) Patent No.: US 9,552,252 B2
(45) Date of Patent: Jan. 24, 2017

(54) METHODS AND APPARATUSES UTILIZING CHECK BIT DATA GENERATION

(71) Applicant: Seagate Technology LLC, Cupertino, CA (US)

(72) Inventors: Jon D. Trantham, Chanhassen, MN (US); Brian T. Edgar, Minneapolis, MN (US); Mark Gaertner, Vadnais Heights, MN (US); Bruce Buch, Westborough, MA (US)

(73) Assignee: Seagate Technology LLC, Cupertino, CA (US)

( * ) Notice: Subject to any disclaimer, the term of this patent is extended or adjusted under 35 U.S.C. 154(b) by 80 days.

(21) Appl. No.: 14/467,983

(22) Filed: Aug. 25, 2014

(65) Prior Publication Data
US 2016/0055053 A1    Feb. 25, 2016

(51) Int. Cl.
*H03M 13/00* (2006.01)
*G06F 11/10* (2006.01)
*H03M 13/09* (2006.01)

(52) U.S. Cl.
CPC .......... *G06F 11/1004* (2013.01); *H03M 13/09* (2013.01); *H03M 13/096* (2013.01)

(58) Field of Classification Search
None
See application file for complete search history.

(56) References Cited

U.S. PATENT DOCUMENTS

| 6,467,060 | B1 | 10/2002 | Malakapalli et al. | |
|---|---|---|---|---|
| 7,539,924 | B1 | 5/2009 | Vasquez et al. | |
| 8,397,101 | B2 | 3/2013 | Goss et al. | |
| 8,433,977 | B1 | 4/2013 | Vasquez et al. | |
| 9,021,336 | B1* | 4/2015 | Northcott | G06F 11/1068 714/752 |
| 9,146,808 | B1* | 9/2015 | Butler | G06F 11/1064 |
| 2008/0055323 | A1* | 3/2008 | Franaszek | G06F 12/0897 345/530 |
| 2009/0037782 | A1* | 2/2009 | Hughes | G11C 29/024 714/53 |
| 2012/0203980 | A1* | 8/2012 | Flynn | G06F 17/30949 711/154 |
| 2014/0040697 | A1* | 2/2014 | Loewenstein | G06F 11/1016 714/758 |
| 2015/0286524 | A1* | 10/2015 | Trantham | G06F 11/108 714/766 |

* cited by examiner

*Primary Examiner* — Daniel McMahon
(74) *Attorney, Agent, or Firm* — Crawford Maunu PLLC

(57) ABSTRACT

Certain exemplary aspects of the present disclosure are directed towards methods and apparatuses in which logic circuitry generates an error detection code based on user data received from a host, and further generates a first set of check bits, to be written to the non-volatile memory circuit in conjunction with the user data, by combining the error detection code with a hashed data address of the user data. In some embodiments, the check bits associated with the user data providing verification that the user data was written in the appropriate physical block address of the non-volatile memory circuit.

20 Claims, 5 Drawing Sheets

METHODS AND APPARATUSES UTILIZING CHECK BIT DATA GENERATION

SUMMARY

Various example embodiments are directed to methods and/or apparatuses in which an error detection code is generated based on user data received from a host. A first set of check bits (also known as a check bit field) is also generated, such as to be written to non-volatile memory in conjunction with the user data, by combining the error detection code with a data address of the user data. In some embodiments, the check bits associated with the user data provide verification that the user data was written to and retrieved from the appropriate address of non-volatile memory. Such approaches may, for example, be carried out in one or more types of logic circuitry.

Consistent with various other embodiments and aspects of the present disclosure, an apparatus is disclosed including a non-volatile memory circuit, a host interface circuit, and logic circuitry. The host interface receives data read/write commands from a host and transfers data between the host and the non-volatile memory. Upon receiving a data write command from the host, the logic circuitry processes user data received from the host and generates an error detection code associated with the user data. A first set of check bits is generated by combining the error detection code with a hashed address of the data. The user data, in conjunction with the check bits, is then written to the non-volatile memory. In this context, certain embodiments of the present disclosure also reduce the likelihood of redundant check bit sequences with a plurality of sequential address sequences, thereby improving the detection capability for data errantly stored or retrieved at improper addresses.

Consistent with yet further embodiments of the present disclosure, an apparatus is disclosed including a non-volatile memory, a host interface circuit and logic circuitry. The logic circuitry reads data from the non-volatile memory circuit based on a command from a host (as received from the host interface circuit). Upon reading the requested data (and its accompanying check bits) from the non-volatile memory circuit, the logic circuitry generates a second set of check bits based on the data address and the data retrieved from the requested data address. The logic circuitry validates, based on a comparison of the first and second set of check bits, that the address of the data received from the non-volatile memory circuitry matches the address of the data requested from the host device. As discussed in more detail herein, by using check bits in conjunction with user data, various enhancements/benefits might be realized. These benefits may include the ability to determine whether data written to a specific address of a non-volatile memory circuit was intended to be written to that address. In the alternative, it may be determined that the user data was not intended to be written to that address, and the check bits can be used to determine the intended address of the user data.

The above discussion/summary is not intended to describe each embodiment or every implementation of the present disclosure. The figures and detailed description that follow also exemplify various embodiments.

DESCRIPTION OF THE FIGURES

Various example embodiments may be more completely understood in consideration of the following detailed description in connection with the accompanying drawings, in which.

Figure 1:
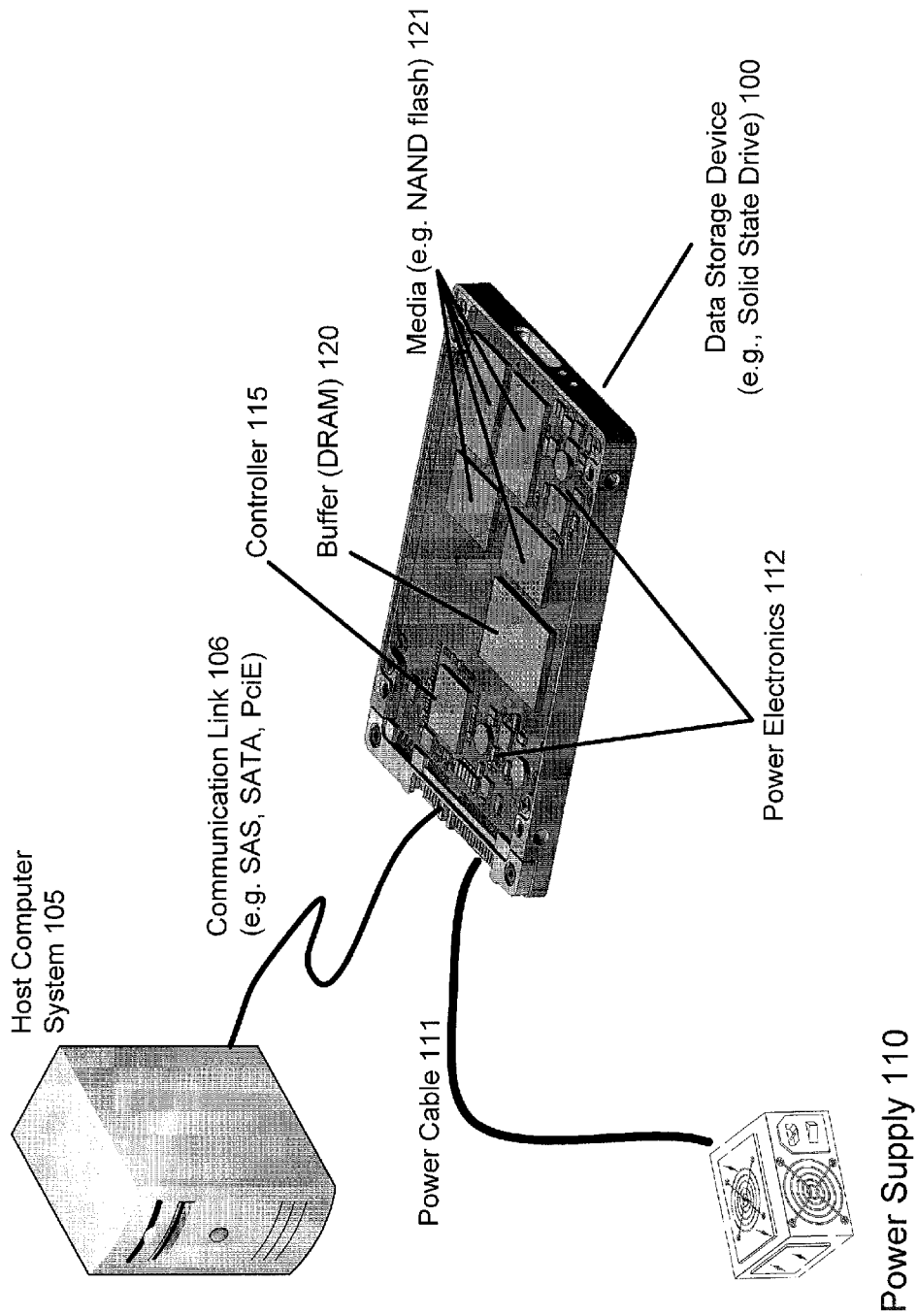
FIG. 1 is a diagram illustrating a data storage device, consistent with various aspects of the present disclosure, within a computer system environment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. In addition, the term "example" as used throughout this application is only by way of illustration, and not limitation.

DETAILED DESCRIPTION

Aspects of the present invention are believed to be applicable to a variety of different types of methods, devices, systems and arrangements that store data in data storage devices, such as, for example, the circuitry that stores data in a magnetic media in a hard disk drive (HDD) or the circuitry that stores data in the NAND flash memory of a solid-state drive (SSD). The techniques described herein are not limited to these devices and are generally applicable to a variety of data storage devices, including ones utilizing volatile memory.

Data storage devices generally receive data from a host, such as a computer or server, for storage and later return the data to the host upon a retrieval request from a host. In many data storage devices, the data are received in blocks (e.g. 512 bytes), each with a corresponding logical block address (LBA) and are written to physical locations within the data storage device. The physical storage location of the data is referred to as the physical block address (PBA) of the data. Some data storage devices, such as object storage devices, store data differently. These devices, instead of using logical block addressing, write data to objects referenced by a key-value data handle and offsets within that object.

The proper operation of data storage devices may be susceptible to corruption from a variety of sources. Examples of device corruption sources include, logic gate and memory upsets from alpha and neutron particles, firmware bugs, timing errors, electrostatic discharge events, excessive heat, electrical noise, etc., any of which may cause the data storage device to malfunction. In some cases the corruption condition can linger, affecting the storage of a plurality of blocks/sectors/pages. Often in a data storage device, many blocks of data are sequentially stored in one command sequence. If the corruption is detected after storage, i.e. upon data retrieval in a read command, the error may be uncorrectable and so is readily apparent to the host system. Determining the source of error after these sorts of malfunctions has occurred can be very difficult, and it is even more difficult to determine the intended address location of miss-located data.

The storage media of data storage devices may also be susceptible to asymmetric noise or interference from adjacently-stored data such as data that is stored in tracks of discs and read by transducers in a HDD, or adjacent cell capacitive coupling in a SSD. Specific embodiments of this disclosure are believed to be particularly beneficial to both hard disc drives and solid-state drives as described above. While the present disclosure is not necessarily so limited, various aspects thereof may be appreciated through a discussion of examples using this context.

Consistent with various embodiments and aspects of the present disclosure, an apparatus is disclosed including a non-volatile memory circuit, a host interface circuit and logic circuitry. The host interface receives data read/write commands from a host and transfers data between the host and the non-volatile memory circuit. Upon receiving a data write command from the host, the logic circuitry processes user data received from the host and generates an error detection code associated with the user data. A first set of check bits is generated by combining the error detection code with a hashed data address of the data. In one embodiment, the address is the logical block address of the data used by the host. Alternately, the address value hashed may be some other address associated with the data, such as the physical block address at which the user data is to be written on/in the non-volatile memory circuit. In some embodiments, the value hashed is the hashed data handle key value of an object storage device (OSD) object combined with an offset value of the data. The user data in conjunction with the check bits are then written to the non-volatile memory circuit. In this context, certain embodiments of the present disclosure reduce the likelihood of redundant check bit sequences with a plurality of sequential addresses, thereby improving the detection capability for data errantly stored at improper addresses Consistent with yet further embodiments of the present disclosure, an apparatus is disclosed including a non-volatile memory circuit, a host interface circuit and logic circuitry. The logic circuitry reads data from the non-volatile memory circuit based on a command from the host (as received from the host interface circuit). Upon reading the requested data (and its accompanying check bits) from the non-volatile memory circuit, the logic circuitry generates a second set of check bits based on the hashed data address and the data retrieved from the requested data address. The logic circuitry validates, based on a comparison of the first and second set of check bits, that the data retrieved from the non-volatile memory circuitry is indeed the data requested by the host device from the proper address. As discussed hereinabove, by using check bits in conjunction with user data, various enhancements/benefits might be realized.

In certain embodiments of the present disclosure, logic circuitry is responsive to a failure to validate data retrieved from the data address of several sequential data blocks by determining the correct LBAs of the user data, based upon the user data, the check bits associated with the user data and the check bits associated with the user data immediately adjacent the data address. In further more specific embodiments, the logic circuitry is operable, based on the use of such check bits, for determining a unique LBA for the user data 99.9977% of the time when given three sequential LBAs stored at any physical location within the device, assuming a 33-bit LBA width.

In many embodiments, the check bits include a hashed/pseudo-random number computed from the address of the user data. In this way, the number of check bits can be less than the number of data address bits. For example, a 16-bit check field may be generated from a 40-bit data address.

In more specific embodiments, hash logic circuitry that pseudo-randomly assigns a hashed data address associated with the data address where the user data is to be stored, prior to combining the check bits generated by the error detection code applied to the data (determined by logic circuitry) with the hashed data address. This combination forms a composite check bit field that is then joined to the user data and written to a non-volatile memory circuit. These embodiments may be implemented with those described above and/or in connection with the illustrated examples below. In certain specific embodiments, the hash logic circuitry calculates a hashed value of the data address using only XOR, NOT and AND logic gates, and which may incur no carry information that must propagate across the bit width of the check bits calculation, the hashed value being unique for all address numbers that are multiples of a specified power of 2 (e.g. $2^{16}$). In some embodiments, the hash logic circuitry repeats the hashed data address once every 65,536 LBAs and/or within a logical band of data addresses.

In certain embodiments of the present disclosure, logic circuitry determines intended addresses of sequential user data that has been determined to be incorrectly written to its current addresses. Specifically, the desired addresses for the user data are determined by assuming the error detection code (EDC) of the user data are correct, computing and backing out the EDC from the check bits (by XOR) to obtain the hashed address values, and then searching for a sequence of sequential addresses whose hashed values match those stored. In some embodiments, the search is completed by computing the hashed value of all possible valid addresses.

Various aspects of the present disclosure are directed toward methods of encoding/decoding data used for error correction in a non-volatile memory circuit. Upon receiving a request to write data in a non-volatile memory circuit, an error detection code is used to generate a check bit field based on user data received from the host. A first set of check bits is generated by combining the check bit field with a hashed data address of the user data, and the combined check bit field is written with the user data in the non-volatile memory circuit. In some embodiments, a hashed value of the user data address is computed using only XOR, NOT and AND logic gates without requiring propagation of carry information across the bit width of the check bit field calculation, and is used in generating the first set of check bits. Upon receiving a request to retrieve the user data from the non-volatile memory circuit, a second set of check bits is generated, based on the data address and data retrieved from a data storage location identified by the address. The data retrieved from the data address is validated based on the first and second sets of check bits.

In further embodiments of the method discussed above, a unique LBA of the user data is determined. The data retrieved from the data address is validated by also generating a second set of check bits for the neighboring user data, based on each of the neighboring user datas' respective data addresses and data retrieved from each of the data addresses.

In one specific embodiment of the present disclosure, hashing logic is implemented in C computer programming code, but in other embodiments may be directly implemented in hardware utilizing standard logic gates. In the exemplary hashing logic produced below, the HASH_LOGIC function takes a 40-bit number (the parameter "lba") as an input and performs computations on the input, utilizing the Hash16 subroutine, and returns a 16-bit hash number as its output:

```
#define ui8    unsigned char
#define ui16   unsigned short
#define ui32   unsigned long
#define ui64   unsigned __int64
ui16 Hash16(ui16 x)
{
  ui16 hash = 0;
  if (x & 1) hash = hash ^ 0xEEEE;
  if (x & 2) hash = hash ^ 0x7777;
  if (x & 4) hash = hash ^ 0xCCCC;
  if (x & 8) hash = hash ^ 0xAAAA;
  if (x & 0x10) hash = hash ^ 0x0FFF;
  if (x & 0x20) hash = hash ^ 0x0666;
  if (x & 0x40) hash = hash ^ 0x0444;
  if (x & 0x80) hash = hash ^ 0x0AAA;
  if (x & 0x100) hash = hash ^ 0x55;
  if (x & 0x200) hash = hash ^ 0x22;
  if (x & 0x400) hash = hash ^ 0xDD;
  if (x & 0x800) hash = hash ^ 0xBB;
  if (x & 0x1000) hash = hash ^ 0x2;
  if (x & 0x2000) hash = hash ^ 0x1;
  if (x & 0x4000) hash = hash ^ 0xC;
  if (x & 0x8000) hash = hash ^ 0x4;
  return hash;
}
// Calculates hash for a 40-bit LBA
ui16 HASH_LOGIC(ui64 lba)
{
  ui8 usw = (lba >> 34) & 0x003F; // lba[39:34]
  ui16 msw = (lba >> 18) & 0xFFFF; // lba[33:18]
  ui16 lsw = (lba >> 2) & 0xFFFF; // lba[17:2]
  ui16 uswhash = Hash16((usw | (usw << 8)) ^ 0xFF00);
  ui16 lswhash = Hash16(lsw ^ 0xAAAA);
  ui16 mswhash = Hash16(msw);
  ui8 lsb = lba & 3;         // lba[1:0]
  switch(lsb)
  {
      case 0: return(    msw ^ uswhash ^ mswhash ^ lswhash       ^ 0xF000);
      case 1: return(    msw ^ uswhash ^ mswhash ^ lswhash ^ lsw ^ 0x7000);
      case 2: return(          uswhash ^ mswhash ^ lswhash ^ lsw ^ 0x2000);
      case 3: return(usw ^ msw ^ uswhash ^ mswhash ^ lswhash ^ lsw ^ 0x4000);
  }
}
```

The following discussion provides various example approaches and aspects involving the use of check bits to verify the proper placement of user data in a memory device, as well as determining the appropriate LBA the data is associated with. In each example, interactions between error detection code and a data address of user data are characterized in the form of check bits and associated with user data. These approaches and aspects (as discussed herein) can be carried out and implemented, alone or together in various combinations thereof, using one or more of the components as discussed in reference to FIGS. 1-5, and as otherwise described herein. Some of these example embodiments are directed to methods of generating check bits and/or verifying proper placement of user data based on its associated check bits. Other embodiments are directed to apparatuses that operate to carry out some or all of the respective steps.

Turning now to the figures, various examples of the present disclosure are presented by way of the illustrations provided beginning with FIG. 1. As may be implemented consistently with the above-discussed exemplary context, FIG. 1 is a diagram illustrating a data storage device, in accordance with various aspects of the present disclosure involving a computer system environment. A data storage device 100 (e.g., a hard disc drive, solid-state disc drive, a combination thereof or any other form of memory storage device) is communicatively coupled with a host computer system 105 via a communication link 106, in a wired or wireless configuration. The communication protocol over which the data storage device 100 and host computer system 105 communicate may, for example, include one or more of SAS, SATA, or PciE protocols.

The data storage device 100 is powered by power supply 110 via power cable 111, and may otherwise be powered by an on-board battery or the host computer system 105. Power electronics circuitry 112 on-board the data storage device 100 regulates the electrical power received from power supply 110. Controller 115 may include circuitry for communicating with the host computer system 105, as well as logic circuitry for reading and writing data to memory, among other functionality. In the embodiment of FIG. 1, the data storage device 100 includes both volatile memory (e.g., buffer (DRAM) 120) and non-volatile memory (e.g., NAND Flash 121). In other embodiments, the non-volatile memory may take the form of a disc drive or a combination of both a disc drive and solid-state memory.

In a computer system environment (such as FIG. 1), the host computer system 105 requests that a set of data be written to the media 121 and immediately accompanies the write command with the data to be written. The controller 115 may temporarily store the data to be written to the media 121 in a buffer (DRAM) 120, for example if the data storage device 100 is fulfilling other read/write commands from the host computer system 105. The received data is held, and later written to the media 121. In many cases, the data is moved (written to a different physical media location) and/or rewritten a number of times over the time period that any particular bit of data is stored on the media 121, as may be applicable to space requirements for subsequent write operations, data integrity of the media, rewrite operations (e.g., as required by the reliability of the media) and other conditions. Accordingly, the data over time becomes increasingly susceptible to failure modes and/or software bugs that may result in the data being overwritten by other data or being written to the wrong data location on the media 121.

To mitigate and/or prevent such issues as identified above, and as may further be implemented in more detailed embodiments in reference to FIGS. 2-5, the controller 115 utilizes check bits to verify both the integrity of user data in a memory device (via the EDC) and the addressing (via the hashed address field). When a host interface receives data write commands from a host computer system 105 and transfers data between the host and the non-volatile memory circuit, logic circuitry processes the user data received from the host and generates an error detection code associated with the user data. A first set of check bits is generated by combining the error detection code with a hashed data address. The user data is then written in conjunction with the check bits to the non-volatile memory circuit. When the controller 115 receives a command to read the user data, the logic circuitry generates a second set of check bits based on the data address and the data retrieved from the requested data address. The logic circuitry validates that the data retrieved from the non-volatile memory circuitry is indeed the data requested from the host device, based on a comparison of the first and second set of check bits.

Figure 2:
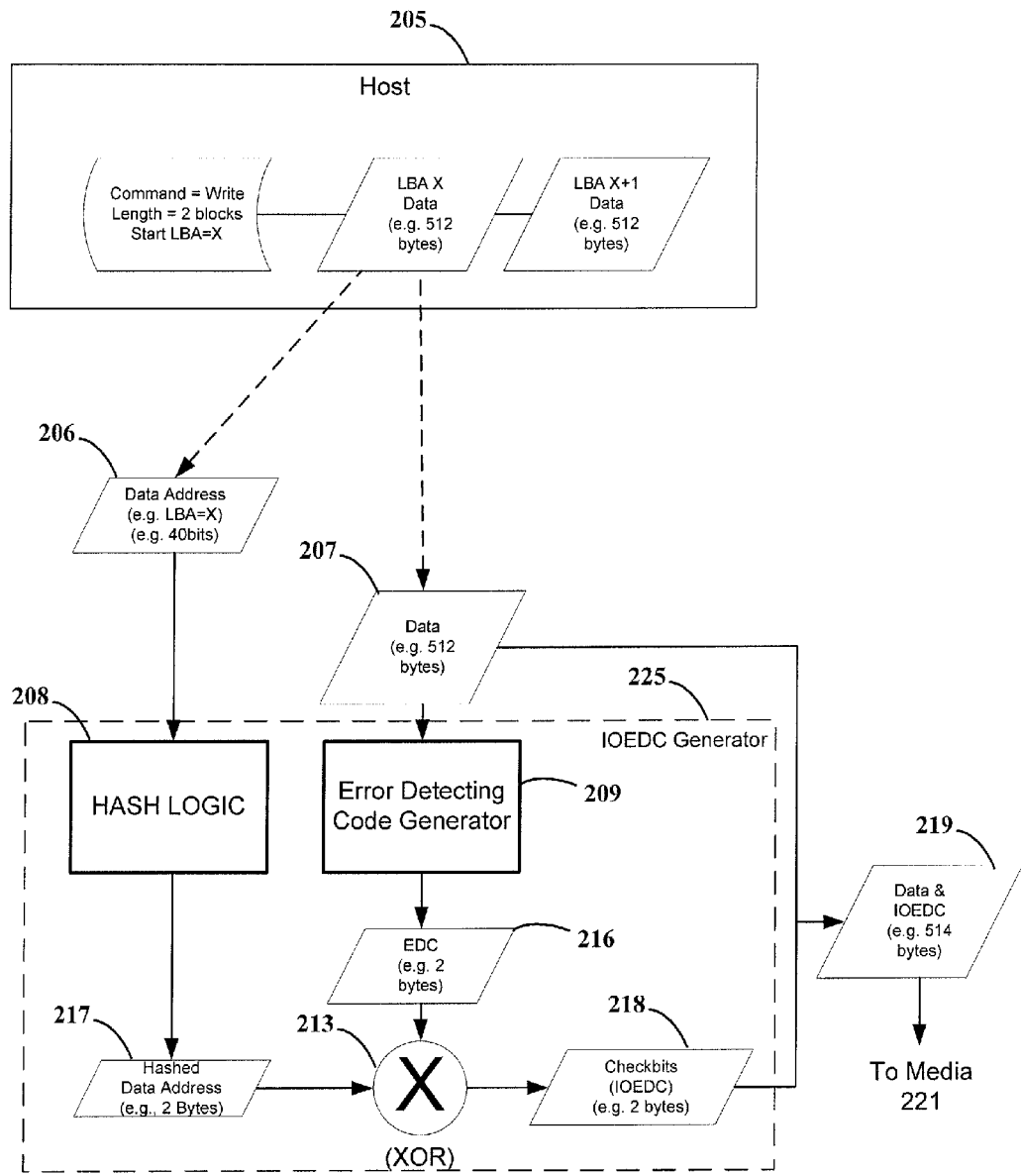
FIG. 2 is a block diagram of logic circuitry, consistent with various aspects of the present disclosure.

FIG. 2 shows a data write operation, in accordance with the present disclosure. As may be implemented in connection with other embodiments and as shown in FIG. 1, host 205 sends a write command for a block of data to be written to media 221. The write command consists of data and a LBA assignment, is received by an input/output EDC (IOEDC) Generator 225 (e.g., within a data storage device), and the command is split. The data address 206 is sent to Hash Logic circuitry 208 and the data 207 is processed by Error Detecting Code Generator circuitry 209. The Error Detecting Code Generator circuitry 209 processes the data 207 to produce an EDC 216 associated with data 207.

The Hash Logic Circuitry 208 runs the data address 206 (~40 bits) through a hashing pseudorandom algorithm that minimizes processor time by using trivial computations (e.g., XOR, NOT and AND logic gates). The result is a hashed data address 217 (~16 bits) whose value appears pseudo-randomly in a logical block space (e.g., between 0x10000000-0x20000000), and greatly decreases the additional data space that must be allocated for the LBA. The hashed data address 217 is then combined 213 (XOR) with the EDC 216, resulting in check bits 218 (~16 bits). The data 207 and check bits 218 (data and IOEDC as combined, 219) are then written to media 221.

Figure 3:
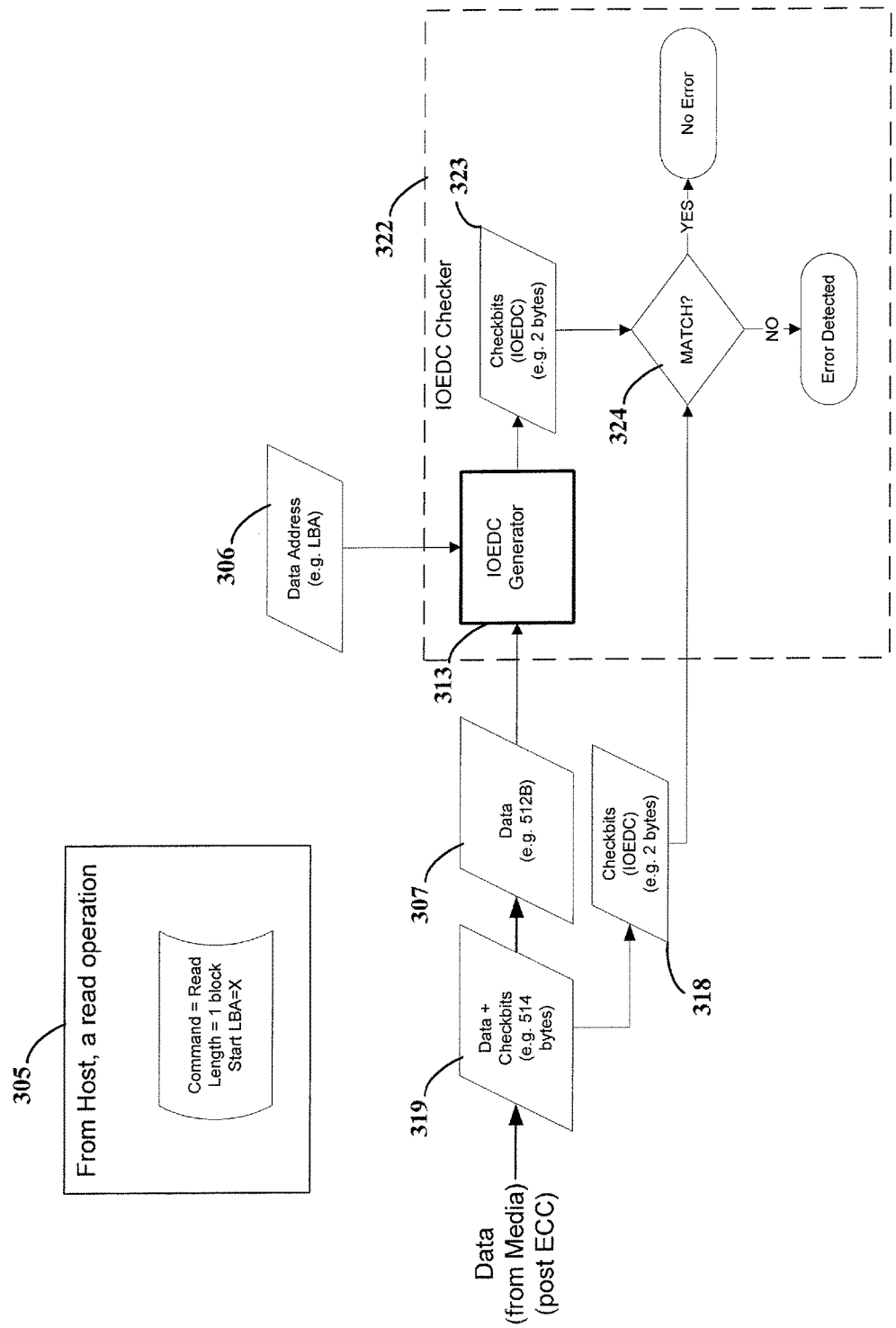
FIG. 3 is a block diagram of logic circuitry, consistent with various aspects of the present disclosure.

FIG. 3 is a block diagram of logic circuitry, consistent with various aspects of the present disclosure. In FIG. 3, host 305 sends a read command to the data storage device (not shown). The data address 306 is put into the IOEDC generator 313 (see 225 in FIG. 2). The requested data address 306 is also used by the data storage device to retrieve the user data associated with that data address. The retrieved data and corresponding check bits 319 are separated from one another. The data 307 enters the IOEDC checker 322 where the data 307 and the data address 306 is combined by IOEDC generator 313. The check bits 323 that are produced by the IOEDC generator 313 is then compared at 324 with the check bit 318 which was retrieved from the media with the data 307 (used in part to produce the other check bits 323). If the check bits 318 and 323 match, the data 307 produced, is the data requested by the host's read command (data address 306). If not, then the data does not match, indicating the presence of an error.

Upon the detection of an error, the data storage device can perform remedial action, including reprogramming control registers and retrying the read operation. If the retry proves again unsuccessful, an error status can be returned to the host computer.

In the case where the IOEDC checker 322 determines that the requested data and the data stored at that LBA do not match for several consecutive sectors, the LBA where the retrieved data 307 was intended to be written can likely be determined. First, the contribution of the data 307 is removed from the check bit 318 by computing the data's EDC and XORing the value with the check bits to determine the hashed data address of the consecutive sectors and then searching for a sequence of sequential addresses whose hashed values match those stored. In some embodiments, this search computes the hashed value of all possible valid addresses. A couple applications for such a computation include as part of a "heroic" data recovery step or as part of a reconstructive failure analysis.

Figure 4:
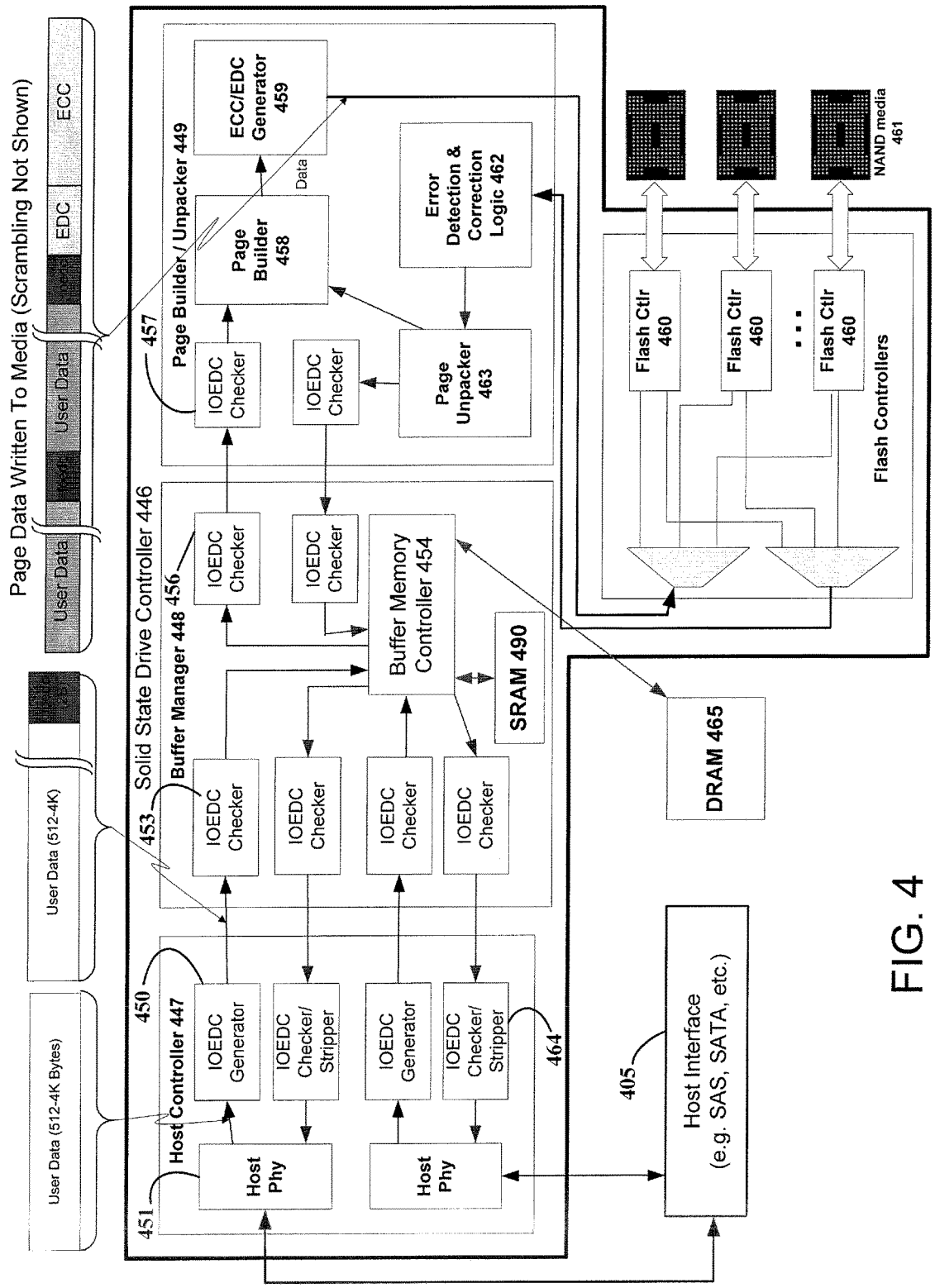
FIG. 4 is a block diagram of logic circuitry for a solid state drive controller, consistent with various aspects of the present disclosure.

FIG. 4 is a block diagram of logic circuitry for a solid state drive controller, consistent with various aspects of the present disclosure. In such an embodiment, the host interface 405 controls the solid state drive controller 446 through read and write commands originating from the host (not shown). The host interface may include multiple channels between the physical hosts (host phy) 451 (within host controller 447) through which data and commands can be transmitted. After the physical host 451 has received a write command, a check bit field is generated by the IOEDC Generator 450 and the check bit field (IOEDC) is added to the end of the user data provided by the host interface 405. In some implementations, the check bit field is determined based on the user data and LBA, as may be implemented as discussed in reference to FIG. 2.

The user data and accompanying check bit field is then transmitted to buffer manager 448 where IOEDC checker 453 verifies that the check bit field is accurate, based on the user data and LBA. The data and accompanying check bit field is then forwarded to the buffer memory controller 454. Based on the read/write queue for the NAND flash media 461, the size of the data, the priority of the read/write command, etc., the data is stored in short term memory (SRAM 490), medium term (DRAM 465) or can be immediately sent on to page builder 449 for processing.

When the write command from the host interface 405 reaches the top of the processing queue, the buffer memory controller 454 retrieves the user data, which is passed through another IOEDC checker 456 to verify that the retrieved data is the intended data. Once in the page builder/unpacker module 449, the user data goes through one last IOEDC checker 457 (to verify that there were not transmission related errors that occurred between the two modules), through a page builder 458 (to prepare the data packet for writing to the NAND flash media 461), and through an error correction code (ECC)/EDC generator 459 (where additional error detection and correction code redundancy is added to the user data). The finalized data packet (including the user data, IOEDC data, ECC and EDC data) is forwarded to the flash controller 460 that writes the data packet to the NAND flash media 461.

In the solid state drive embodiment of FIG. 4, when a read command is received by the host interface 405, the read request is forwarded to the flash controller 460 associated with the requested LBA. After the requested user data is retrieved by the flash controller 460, the user data goes through error detection and correction logic 462. Once the user data is verified and potentially corrected for errors, the data is unpacked from pages into logical blocks at page unpacker circuitry 463. The user data is double checked at IOEDC checkers 457 & 456 to verify that the retrieved data was from the intended LBA. Depending on the state of the host, the retrieved user data may be stored in the buffer until such time that the host indicated that it is ready to receive the requested user data. When the host is ready, IOEDC checker 453 checks the user data one more time to verify that the correct data for the request was retrieved; the IOEDC data is then removed from the user data by IOEDC stripper 464 prior to transmission to the host-by-host interface 405.

While multiple IOEDC checkers (e.g. at 453, 456, 457, 464, etc.) may seem redundant, they provide at least two advantages. First, corruptions are identified nearly immediately, offering a higher probability of recovering the correct data by the control logic. Second, they help isolate any data corruptions to the subsystem wherein the corruption occurred easing failure analysis. In some embodiments, two or more IOEDC checker circuits are respectively located between boundaries of subsystems in the controller, and reduce or eliminate data communication issues. For instance, each IOEDC checker circuit may include a set of the logic circuitry and operate by, for user data communicated between the subsystems, generating an error detection code, generating check bits and writing the check bits, as discussed in one or more embodiments herein.

Figure 5:
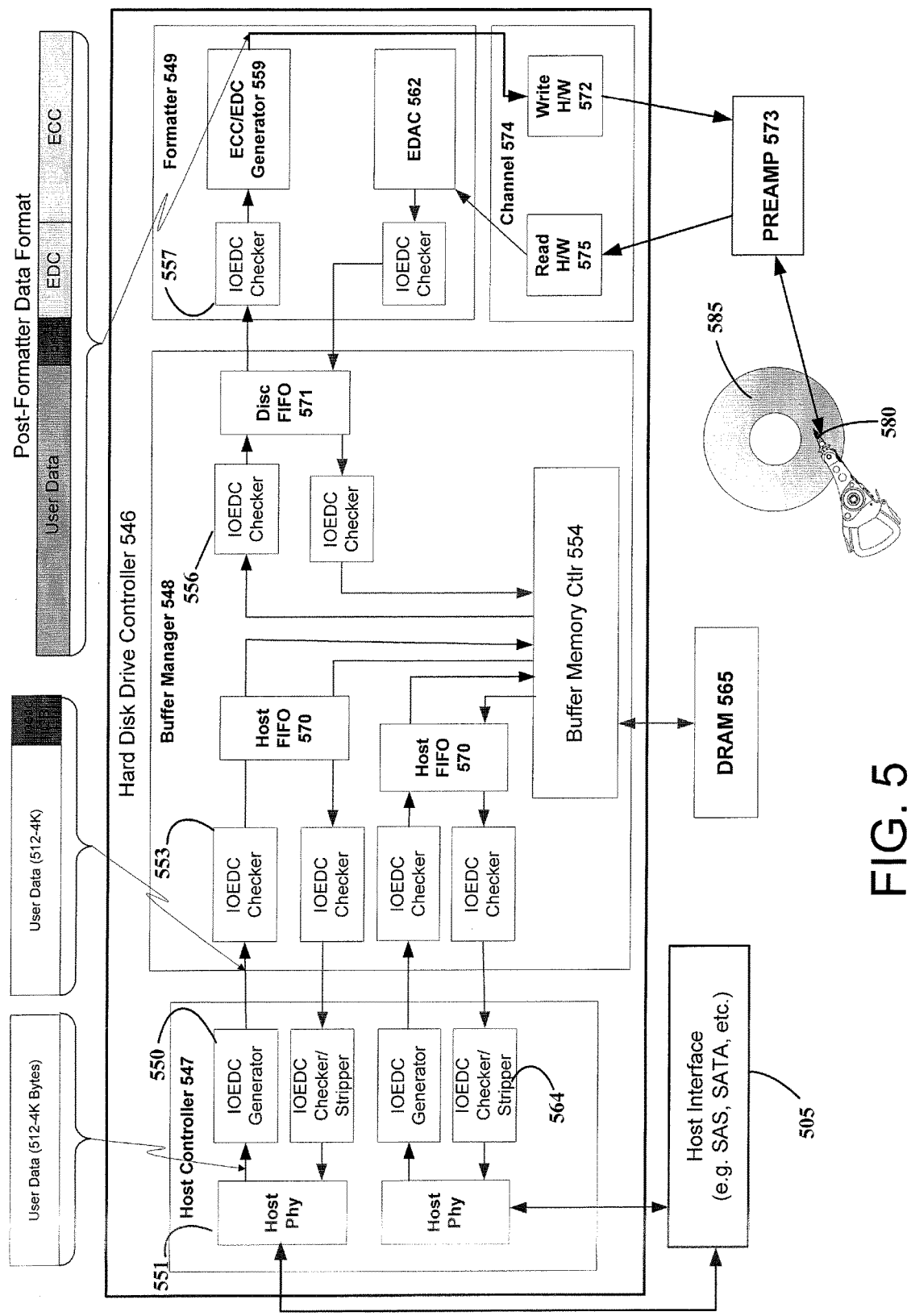
FIG. 5 is a block diagram of logic circuitry for a hard disc drive controller, consistent with various aspects of the present disclosure.

FIG. 5 is a block diagram of logic circuitry for a hard disc drive controller, consistent with various aspects of the present disclosure. Similar to the discussion of FIG. 4, the host interface 505 controls the hard disc drive controller 546 through read and write commands originating from the host (not shown). The host interface 505 may include multiple channels between the physical hosts (host phy) 551 (within host controller 547) through which data and commands can be transmitted (allowing for parallel operations). After the physical host 551 has received a write command, a check bit field is generated by the IOEDC Generator 550 and the check bit field (IOEDC) is added to the end of the user data provided by the host interface 505. The check bit field may, for example, be determined based on the user data and LBA (associated with the write command), using an approach as discussed in more detail in reference to FIG. 2.

The user data and accompanying check bit field is transmitted to buffer manager 548 where IOEDC checker 553 verifies that the check bit field generated by IOEDC generator 550 is accurate, based on the user data and LBA. The data and accompanying check bit field is then forwarded through a host FIFO 570, which acts as a temporary buffer until the buffer memory controller 554 signals that it is ready to receive the user data. Based on the read/write queue for the disc drive, the size of the user data, the priority of the read/write command, or other aspects, the data is stored in short-medium term memory (DRAM 565) or is immediately sent on to formatter circuitry 549 for further processing.

When the write command from the host interface 505 reaches the top of the processing queue, the buffer memory controller 554 retrieves the user data from the DRAM 565 and passes the data through another IOEDC checker 556 to verify that the retrieved data is the intended data. The user data may be temporarily buffered in disc FIFO 571, depending on the availability of the formatter circuitry 549. When the user data is received by the formatter circuitry 549, the user data is again verified by IOEDC checker 557 (to verify that there was not transmission related errors that occurred between the two modules), and is then processed through an ECC/EDC generator 559 (where error detection and correction code redundancy is added to the user data). The data packet to be written to media 585 (including the user data, IOEDC data, ECC and EDC data) is forwarded through channel 574 (specifically write H/W 572) and the preamp 573 to a write transducer 580, which writes the user packet to the media 585.

In the hard disc drive embodiment of FIG. 5, when a read command is received by the host interface 505, and when the read request is received by the hard disc drive controller 546, the transducer 580 is positioned over the media 585 associated with the requested LBA. The signal received by the transducer 580 is then processed by the preamp 573, channel 575 (read H/W) and error corrected in the EDAC circuitry 562. Once the user data is verified, the user data is double-checked at IOEDC checkers 557 & 556 to verify that the retrieved data was intended to be written to the retrieved LBA. Depending on the state of the host, the retrieved user data may be stored in the DRAM buffer 565, based on the determination of the buffer memory controller 554, until such time that the host indicates that it is ready to receive the requested user data. When the host is ready, buffer memory controller 554 releases the user data, and IOEDC 553 checks the user data one more time to verify that the correct data for the request was retrieved by the buffer memory controller 554. The IOEDC data is then removed from the user data by the IOEDC checker/stripper 564 prior to transmission to the host by host interface 505.

As discussed hereinabove, by using check bits in conjunction with user data, various enhancements/benefits might be realized. These include the ability to determine whether data written to a specific PBA of a non-volatile memory circuit is consistent with the LBA for that data. Alternately, if a PBA is used as a hashed data address input, it includes the ability to determine whether data written to a specific PBA of a non-volatile memory circuit was intended to be written to that PBA. In either case, these may also provide an ability to determine that user data was not intended to be written to an address, and the check bits may be used to determine the intended address of the user data. In this context, certain embodiments of the present disclosure also prevent the redundancy of such error detection codes, especially in sequential addresses, which could otherwise lead to undetected addressing errors. As another example, increased error detection is realized through the avoidance of arithmetic algorithms which take up significantly more processing time then simpler computations (e.g., XOR and AND logic). Further, by using the check bits to understand origin of the user data, increased user data can be realized in the non-volatile memory circuit due to the combination of address and error correction data that typically comprise separate data blocks (both accompanying a length of user data). In certain more specific embodiments, the non-volatile memory circuit includes a hard disc drive. Due to the complexities and sensitivities of modern data storage devices, often involving frequent data manipulation and movement, the likelihood of writing and reading data in to/from an erroneous location can be increased. Various embodiments address such aspects with apparatuses, approaches and methodologies for increasing data storage device performance and minimizing the likelihood of data loss.

As consistent with various embodiments herein, a non-volatile memory circuits as discussed throughout this disclosure may include one or more of a solid-state storage device, battery-backed DRAM, ROM and magnetic or optical storage such as a hard disk drive, magnetic tape or optical disk. Solid-state storage devices may, for example, include non-volatile memory such as flash memory, phase change memory, spin-torque RAM, and the ROM may include, for example, PROM, EPROM or EEPROM. Hybrid mixtures of storage devices and components within a data storage device are also considered.

Various modules or other circuits may be implemented to carry out one or more of the operations and activities described herein and/or shown in the figures. In these contexts, such modules or blocks are understood to be circuitry that carries out one or more of the described operations/activities (e.g., hash logic circuitry). For example, in certain of the above-discussed embodiments, such modules or blocks are discrete logic circuits or programmable logic circuits configured and arranged for implementing these operations/activities, as in the circuit modules shown in FIGS. 2-5. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). Certain other embodiments are directed to a computer program product (e.g., non-volatile memory device), which includes a machine or computer-readable medium having stored thereon instructions which may be executed by a computer (or other electronic device) to perform these operations/activities. Although certain bit widths are shown frequently throughout this disclosure (for example, the use of 2 bytes for the check bits), embodiments of the present disclosure may be useful for a variety of bit widths.

Based upon the above discussion and illustrations, those skilled in the art will readily recognize that various modifications and changes may be made to the present disclosure without strictly following the exemplary embodiments and applications illustrated and described herein. For example, the claimed circuits/modules need not be present in the data storage device itself, but instead can be located in a host device that controls the data storage device. Such modifications do not depart from the true spirit and scope of the present disclosure, including that set forth in the following claims.

What is claimed is:

1. An apparatus comprising:
a non-volatile memory circuit configured and arranged for storing electronic data;
a host interface circuit configured and arranged to receive and transmit user data between a host and the non-volatile memory circuit; and
logic circuitry configured and arranged to
generate an error detection code based on user data received from the host,
generate a first set of check bits by combining the error detection code with a hashed data address of the user data, and
write the first set of check bits with the user data in the non-volatile memory circuit.

2. The apparatus of claim 1, wherein the logic circuitry is further configured and arranged to, upon receiving a request to retrieve the user data from the non-volatile memory circuit,
generate a second set of check bits based on the hashed data address and data retrieved from a data storage location identified by a data address, and
validate the data retrieved from the non-volatile memory circuit based on the first set and the second set of check bits.

3. The apparatus of claim 2, wherein the logic circuitry is further configured and arranged to, based upon a failure to validate the data retrieved from the non-volatile memory circuit, determine an intended address of the user data based on the user data and ones of the first set of check bits that are associated with the user data and ones of the first set of check bits that are associated with the user data immediately after the data address.

4. The apparatus of claim 3, wherein the logic circuitry determines a unique logical block address for the user data 99.9977% of the time for a 33-bit wide address based on three sequential sets of the user data.

5. The apparatus of claim 1, wherein the apparatus further includes hash logic circuitry configured and arranged to pseudo-randomly assign a hashed data address for the data address of the user data.

6. The apparatus of claim 5, wherein the hash logic circuitry is further configured and arranged to calculate a hashed value of the hashed data address that is unique for all address numbers that are multiples of a specified power of 2.

7. The apparatus of claim 5, wherein the hash logic circuitry is further configured and arranged to compute a hashed value of the hashed data address using only XOR, NOT, and logic gates.

8. The apparatus of claim 5, wherein the hash logic circuitry is further configured and arranged to repeat the hashed data address once every 65,536 logical block addresses.

9. The apparatus of claim 5, wherein the hash logic circuitry is further configured and arranged to prevent the hashed data address from repeating within a logical band of data addresses.

10. The apparatus of claim 1, wherein the logic circuitry is further configured and arranged to determine, in response to a physical block address to which the user data is written being in error, an intended physical block address of the user data based on the first set of check bits.

11. The apparatus of claim 1, wherein the logic circuitry is further configured and arranged to determine, based on the first set of check bits and the user data, a logical block address of the user data.

12. The apparatus of claim 1, wherein the first set of check bits further include a pseudorandom data address based on the hashed address of the user data.

13. The apparatus of claim 1, wherein the number of check bits in the first set of check bits is less than a bit-width of a data address of the user data.

14. The apparatus of claim 1, wherein a bit-length of the first set of check bits is 16-bits and the bit-length of a data address of the user data is 40-bits.

15. The apparatus of claim 1, further comprising a plurality of input-output error detection code (IOEDC) checker circuits between boundaries of subsystems in the apparatus, each IOEDC checker circuit including a set of the logic circuitry and being configured and arranged to, for the user data as communicated between the subsystems: generate the error detection code, generate the first set of check bits and write the first set of check bits.

16. A method of coding electronic data including:
upon receiving a request to write data in a non-volatile memory circuit,
generating a first check bit field, using an error detection code, based on user data received from a host,
combining the first check bit field with a data address of the user data, and writing the combined first check bit field and data address of the user data in the non-volatile memory circuit; and
upon receiving a request to retrieve the user data from the non-volatile memory circuit,
generating a second check bit field based on the data address of the user data and data retrieved from a data storage location identified by the address, and
validating the data retrieved from the data address based on the first check bit field and the second check bit field.

17. The method of claim 16 further including determining a unique logical block address of the user data.

18. The method of claim 16, wherein the step of validating the data retrieved from the data address based on the first check bit field and the second check bit field further includes generating the second check bit field for neighboring user data based on data addresses for the neighboring user data and data retrieved from each of the data addresses.

19. The method of claim 16, wherein the step of combining the first check bit field with the data address of the user data further includes computing a hashed value of the user data address using only XOR, NOT, and logic gates.

20. The method of claim 19, wherein computing the hashed value includes computing the hashed value without propagating arithmetic carry information across a bit width associated with the first check bit field.

* * * * *